United States Patent [19]

Lou

[11] Patent Number: 5,051,618

[45] Date of Patent: Sep. 24, 1991

[54] HIGH VOLTAGE SYSTEM USING ENHANCEMENT AND DEPLETION FIELD EFFECT TRANSISTORS

[75] Inventor: Perry W. Lou, Carlsbad, Calif.

[73] Assignee: Idesco Oy, Oulu, Finland

[21] Appl. No.: 468,917

[22] Filed: Jan. 23, 1990

Related U.S. Application Data

[63] Continuation of Ser. No. 208,761, Jun. 20, 1988, abandoned.

[51] Int. Cl.$^5$ .................... H03K 17/16; H03K 19/003
[52] U.S. Cl. .................................... 307/443; 307/446; 307/450; 307/574; 361/91
[58] Field of Search ............... 307/443, 446, 450, 544, 307/588, 570, 574, 581, 282; 361/90, 91, 58

[56] References Cited

U.S. PATENT DOCUMENTS

| | | | |
|---|---|---|---|
| 3,991,326 | 11/1976 | Kawagoe et al. | 307/574 |
| 4,069,430 | 1/1978 | Masada | 307/450 |
| 4,239,980 | 12/1980 | Takanashi et al. | 307/574 |
| 4,518,926 | 5/1985 | Swanson | 307/450 |
| 4,523,111 | 6/1985 | Baliga | 307/574 |
| 4,578,694 | 3/1986 | Ariizumi et al. | 307/450 |
| 4,771,189 | 9/1988 | Noufer | 307/581 |

*Primary Examiner*—Timothy P. Callahan
*Attorney, Agent, or Firm*—Ellsworth R. Roston; Charles H. Schwartz

[57] ABSTRACT

An enhancement mode field effect transistor and a depletion mode field effect transistor are connected in a circuit to provide for a conductivity of the transistors during a first polarity in an alternating voltage and to provide for a non-conductivity of the transistors during a second polarity in the alternating voltage. The circuit also provides for the continued and proper operation of the circuit even when voltages having a magnitude greater than the breakdown voltage of the enhancement mode field effect transistor are applied to the circuit. Each of the transistors may have a source, a gate and a drain. The gates of the transistors receive an alternating voltage of one polarity at the same time that the drain of the depletion mode field effect transistor receives a voltage of the opposite polarity. The source of the depletion mode field effect transistor and the drain of the enhancement mode field effect transistor are common. The source of the enhancement mode field effect transistor may receive a reference potential such as ground. The transistors are conductive during the application of a positive voltage to their gates and are non-conductive during the application of a negative voltage to their gates. When the transistors are non-conductive, the depletion mode transistor prevents the voltage on the drain of the enhancement mode field effect transistor from exceeding the breakdown value.

8 Claims, 1 Drawing Sheet

HIGH VOLTAGE SYSTEM USING ENHANCEMENT AND DEPLETION FIELD EFFECT TRANSISTORS

This is a continuation, of application Ser. No. 208,761, filed June 20, 1988 now abandoned.

This invention relates to circuits employing field effect transistors. More particularly, the invention relates to circuits employing enhancement mode field effect transistors for operating successfully without breakdown upon the application to the circuits of voltages greater than the breakdown voltage of such transistors.

Enhancement mode field effect transistors are used g fairly often in semiconductor circuits. The enhancement mode field effect transistors have certain important advantages. They respond quickly to become conductive when they receive voltages for making them conductive. They are able to conduct considerable current when they are conductive and they conduct this current at low impedances. As a result, they are relatively efficient. The enhancement mode field effect transistors are also advantageous in that there is a relatively small difference between the voltage applied to the transistors to make them conductive and the voltage applied to the transistors to make them non-conductive. The enhancement mode field effect transistors also have a serious disadvantage. This results from the fact that the transistors break down when a relatively low voltage is applied to the transistors after the transistors have become non-conductive.

A considerable effort has been made, and significant amounts of money have been expended, to overcome the disadvantages resulting from the low breakdown voltages of enhancement mode field effect transistors. In spite of this considerable effort and significant expenditure of money, the problems with the low breakdown voltages in enhancement mode field effect transistors still persists.

Depletion mode field effect transistors have a higher breakdown voltage than enhancement mode field effect transistors. However, depletion mode field effect transistors are disadvantageous in that the transistors become non-conductive only when the voltage on the gates of the transistors is considerably below the voltage on the sources of the transistors. This prevents the output from one such transistor to be introduced as the input to the next transistor, g particularly in data processing systems where there are only two (2) logic levels, one representing a binary "1" and the other representing a binary "0".

This invention provides an invention for combining the advantages of the enhancement mode and depletion mode field effect transistors while eliminating the disadvantages of both transistors. In one embodiment of the invention, an enhancement mode field effect transistor and a depletion mode field effect transistor are connected in a circuit to provide for a conductivity of the transistors during a first polarity in an alternating voltage and to provide for a non-conductivity of the transistors during a second polarity in the alternating voltage. The circuit also provides for the continued and proper operation of the circuit even when voltages having a magnitude greater than the breakdown voltage of the enhancement mode field effect transistor are applied to the circuit.

Each of the enhancement mode and depletion mode field effect transistors may have a source, a gate and a drain. The gates of the transistors receive an alternating voltage of one polarity at the same time that the drain of the depletion mode field effect transistor receives a voltage of the opposite polarity. The source of the depletion mode field effect transistor and the drain of the enhancement mode field effect transistor are common. The source of the enhancement mode field effect transistor may receive a reference potential such as ground.

The transistors are conductive during the application of a positive voltage to their gates and are non-conductive during the application of a negative voltage to their gates. When the transistors are non-conductive, the depletion mode transistor prevents the voltage on the drain of the enhancement mode field effect transistor from exceeding the breakdown value.

Figure 1:
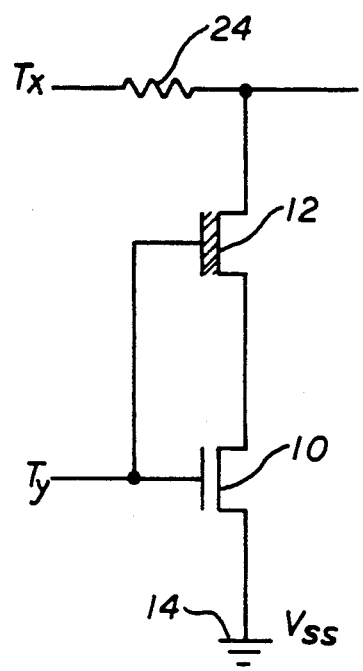
FIG. 1 is a circuit diagram of one embodiment of the invention.

In one embodiment of the invention, an enhancement mode field effect transistor 10 and a depletion mode field effect transistor 12 are provided. Each of the transistors 10 and 12 may be provided with a drain, a source and a gate. The source of the transistor 10 may receive a reference voltage such as a ground 14. The gates of the transistors 10 and 12 may receive an alternating voltage from one terminal designated as "T") of a winding 16 having a center tap connected to receive the reference voltage such as the ground 14. The winding 16 may be included as a secondary winding in a transformer, the primary winding (not shown) of which has an alternating voltage applied to it. The drain of the transistor 10 and the source of the transistor 12 g are common. An alternating voltage is applied to the drain of the transistor 12 from the other terminal (designated as "Tx") of the winding 16.

The transistor 10 is constructed to start to become conductive when a suitable voltage such as approximately eight tenths of a volt (0.8V.) is applied to the gate of the transistor. The transistor 10 becomes non-conductive when a suitable voltage such as approximately zero volts (0V.) is applied to the gate of the transistor. The transistor 12 is constructed to start to become conductive when a suitable voltage such as approximately zero volts (0V.) is applied to its gate. The transistor 12 becomes non-conductive when its gate receives a suitable negative voltage such as approximately three volts ($-3$V.). As will be seen, the depletion mode transistor 12 does not serve as a switch as well as the enhancement mode transistor 10. One reason is that the depletion mode transistor becomes non-conductive only upon the introduction of a negative voltage to its gate relative to the voltage on its source. Another reason is that logic levels of signals in data processing systems require, for one logic level, the voltage on the gate of the transistor to be close to the voltage on the source of the transistor.

In an enhancement mode field effect transistor, the source and drain of the transistor have a relatively strong n mode and the channel between the source and drain of the transistor have a weak n mode. In a depletion mode field effect transistor 12, the source and drain of the transistor also have a relatively strong n mode. The channel between the source and drain of the transistor would normally have a weak p mode. However, a dopant is provided in such channel to convert the channel from a weak p mode to a weak n mode.

Figure 2:
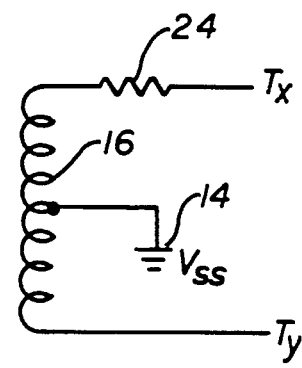
FIG. 2 illustrates a circuit for applying the desired voltages to the different components in the circuit shown in FIG. 1.
Figure 3:
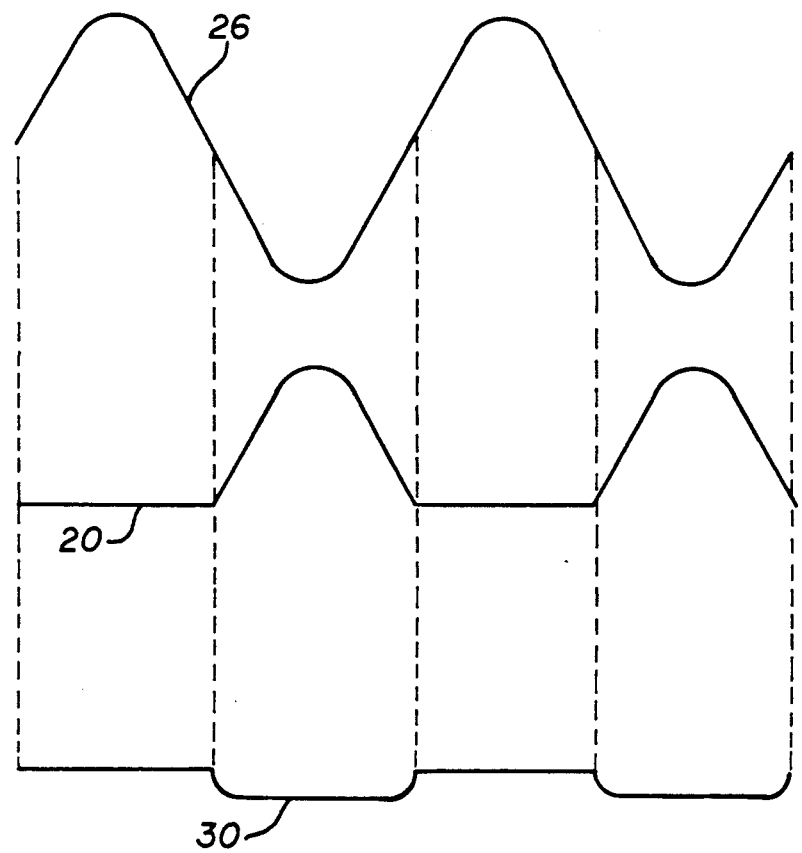
FIG. 3 illustrates waveforms of voltages produced at strategic terminals in the circuit of FIG. 1.

As will be seen from FIG. 2, the voltage 26 applied to the gates of the transistors 10 and 12 is opposite in polarity to the voltage applied to the drain of the transistor 12. When the voltage 26 applied to the gate of the transistor 12 approaches zero volts (0V.) in a positive direction, the transistor is ready to become conductive. However, current does not start to flow through the transistor 12 until the gate of the transistor 10 receives a potential such as approximately eight tenths of a volt (0.8V.). At that time, the transistor 10 also starts to become conductive so that current then flows through a circuit including the transistors 10 and 12. Because of this current, the voltage on the drain of the transistor 12 approaches the ground potential on the source of the transistor 10. The voltage on the drain of the transistor 12 is illustrated at 20 in FIG. 3. The voltage 20 is produced on the drain of the transistor 12 during substantially all of the negative half cycles of the voltage produced in the winding 16 at the terminal Tx for introduction through a resistance 24 to the drain of the transistor 12.

As the voltage applied through the resistance 24 from the winding terminal Tx to the drain of the transistor 12 approaches a zero amplitude in an positive direction, the voltage applied to the gates of the transistors 10 and 12 from the winding terminal Ty approaches a zero amplitude in a negative direction. When the voltage applied to the gate of the transistor 10 from the winding terminal Ty reaches approximately zero volts (0V.) in the negative direction, the transistor 10 becomes non-conductive. However, the transistor 12 has a tendency to be in a conductive state until the voltage on the gate of the transistor 12 approaches a negative potential of approximately three volts ($-3V.$).

In the negative transition between approximately zero volts (0V.) and minus three volts ($-3V.$) on the gate of the transistor 12, the drain of the transistor 10 tends to remain at a low potential near approximately zero volts (0V.) because of the tendency of the transistor 12 to remain conductive until the gate voltage of the transistor 12 approaches minus three volts ($-3V.$). This is illustrated at 30 in FIG. 3. When the potential on the gate of the transistor 12 approaches minus three volts ($-3V.$) in the negative direction, the transistor becomes non-conductive. This causes the voltage on the drain of the transistor 12 to become substantially equal to the voltage on the upper terminal Tx of the winding 16 in FIG. 2.

The depletion mode transistor 12 has a higher breakdown voltage than the enhancement mode transistor 10. This may be because the depletion mode transistor 12 has dopant in the channel between the source and drain of the transistor. This dopant tends to relieve the stress resulting in the transistor from the high voltage applied between the source and drain of the transistor. Because of this, the transistor 12 is able to withstand voltages as high as approximately twenty volts (20V.) between the source and drain of the transistor before breaking down. However, the transistor 10 is able to withstand voltages only as high as approximately fifteen volts (15V.) between the source and drain of the transistor before breaking down. Since a relatively low voltage is applied to the drain of the transistor 10 after the transistor 10 becomes non-conductive, the breakdown voltage in the circuit of FIG. 1 is controlled by the transistor 12.

As will be seen from the above discussion, the circuit shown in FIG. 1 provides the advantages of both the enhancement mode transistor 10 and the depletion mode transistor 12 while eliminating the disadvantages of both transistors. For example, the conversion of the transistors 10 and 12 to the states of conductivity and non-conductivity is controlled by the transistor 10. This is desirable because the gate voltage for producing conductivity and non-conductivity in the transistor 10 is close to the voltage on the source of the transistor. On the other hand, the breakdown voltage of the transistors 10 and 12 in the circuit is controlled by the transistor 12. In this way, the voltage applied to the circuit shown in FIG. 1 can be considerably increased above the voltage which can be applied to the transistor 10 alone before either of the transistors 10 and 12 will break down.

Although this invention has been disclosed and illustrated with reference to particular embodiments, the principles involved are susceptible for use in numerous other embodiments which will be apparent to persons skilled in the art The invention is, therefore, to be limited only as indicated by the scope of the appended claims.

I claim:

1. In combination:

an enhancement mode field effect transistor, a depletion mode field effect transistor, and means for providing an alternating voltage, the depletion mode field effect transistor and the enhancement mode field effect transistor being connected to the alternating voltage means to obtain a flow of a current through the transistors in first alternate half cycles of the alternating voltage and a cut-off of such current through the transistors in the other alternate half cycles of the alternating voltage and to provide for a protection of the enhancement mode field effect transistor against voltage breakdowns after the enhancement mode field effect transistor becomes cut off each of the transistors having a source, a drain and a gate, the source of the depletion mode field effect transistor and the drain of the enhance mode field effect transistor being common, the alternating voltage being applied in one phase to the drain of the depletion mode field effect transistor and being applied in an opposite phase to the gates of the transistors, and means for applying a reference voltage to the source of the enhancement mode field effect transistor.

2. In a combination as set forth in claim 1, the alternating voltage being applied to the drain of the depletion mode field effect transistor with an amplitude greater than the breakdown voltage of the enhancement mode field effect transistor.

3. In combination:

an enhancement mode field effect transistor having a gate, a source and a drain, a depletion mode field effect transistor having a gate, a source and a drain, means for providing an alternating voltage, means for applying the alternating voltage to the gates of the transistors to obtain a conductivity of the transistors in first alternate half cycles of the alternating voltage and to obtain a non-conductivity of the transistors in the other half cycles of the alternating voltage and for applying the alternating voltage to the drain of the depletion mode field effect transistor in a phase opposite to the phase in which the alternating voltage is applied to the gates of the transistors, the amplitude of the voltage applied to the drain of the depletion mode field effect transistor being greater than the breakdown voltage of the enhancement mode field effect transistor, the source of the depletion mode field effect transistor being connected to the drain of the enhancement mode field effect transistor to prevent the enhancement mode field effect transistor from breaking down upon the application to the drain of the depletion mode field effect transistor of the alternating voltage with the amplitude greater than the breakdown voltage of the enhancement mode field effect transistor during the half cycles of the alternating voltage in which the transistors are cut off, and means for providing a reference potential, the source of the enhancement mode field effect transistor being connected to the means for providing the reference potential.

4. In a combination as set forth in claim 3, an impedance connected between the drain of the depletion mode field effect transistor and the means for applying the alternating voltage to the drain of the depletion mode field effect transistor.

5. In a combination as set forth in claim 3, the means for providing the alternating voltage constituting a center tapped winding.

6. In combination, an enhancement mode field effect transistor having properties of becoming conductive upon the introduction to the transistor of a voltage of a first particular magnitude in a positive-going direction and having properties of becoming non-conductive upon the introduction to such transistor of a voltage of a second particular magnitude in a negative-going direction, the enhancement mode field effect transistor having a first breakdown voltage upon a state of non-conductivity in such transistor, a source of a reference potential, a depletion mode field effect transistor having properties of becoming conductive upon the introduction to such transistor of a voltage of a third particular magnitude in a positive-going direction and having properties of becoming non-conductive upon the introduction to such transistor of a voltage of a fourth particular magnitude in a negative-going direction, the depletion mode field effect transistor having a second breakdown voltage upon a state of non-conductivity in such transistor, the second breakdown voltage being greater than the first breakdown voltage, means for connecting the enhancement mode field effect transistor and the depletion mode field effect transistor in a series circuit to the source of reference potential, and means for applying an alternating voltage to the transistors to obtain a state of non-conductivity in the transistors upon the introduction of the alternating voltage of the second particular magnitude to the transistors in the negative-going direction and to obtain the conduction of the transistors upon the introduction of the alternating voltage of the third particular magnitude to the transistors in the positive-going direction and to provide the transistors in the series circuit with the second breakdown voltage upon the production of a state of non-conductivity in the transistors the third particular magnitude of the alternating voltage occurring after the first particular magnitude of the alternating voltage in the positive-going direction and the fourth particular magnitude of the alternating voltage occurring after the third particular magnitude of the alternating voltage in the negative-going direction, each of the depletion mode field effect transistor and the enhancement mode field effect transistor having first, second and third terminals, the alternating voltage being introduced in a first phase to the first terminals of the transistors and being introduced in an opposite phase to the second terminal of the depletion mode field effect transistor and the third terminal of the depletion mode field effect transistor being connected to the second terminal of the enhancement mode field effect transistor and the third terminal of the enhancement mode field effect transistor being grounded.

7. In a combination as set forth in claim 6, a transformer winding having first and second opposite ends, the alternating voltage in the first phase being produced at one opposite end of the transformer winding and the alternating voltage in the opposite phase being produced at the second end of the transformer winding.

8. In a combination as set forth in claim 6, the transformer winding having a grounded center tap.

* * * * *